(12) United States Patent
Figura

(10) Patent No.: US 9,164,273 B2
(45) Date of Patent: Oct. 20, 2015

(54) ELECTROWETTING DISPLAY DEVICE

(71) Applicant: Liquavista B.V., Eindhoven (NL)

(72) Inventor: Daniel Figura, Eindhoven (NL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/134,036

(22) Filed: Dec. 19, 2013

(65) Prior Publication Data

US 2014/0104672 A1   Apr. 17, 2014

Related U.S. Application Data

(63) Continuation of application No. PCT/EP2012/060840, filed on Jun. 7, 2012.

(30) Foreign Application Priority Data

Jun. 24, 2011 (GB) .................................. 1110776.0
Sep. 12, 2011 (GB) .................................. 1115717.9

(51) Int. Cl.
G02B 26/00 (2006.01)
G03F 7/20 (2006.01)

(52) U.S. Cl.
CPC ............ *G02B 26/005* (2013.01); *G03F 7/2008* (2013.01)

(58) Field of Classification Search
CPC ... G02B 26/004; G02B 26/005; G02B 6/3538
USPC .................................................. 359/290–297
See application file for complete search history.

(56) References Cited

U.S. PATENT DOCUMENTS

| 5,757,345 A | 5/1998 | Sheridon |
| 2009/0168144 A1 | 7/2009 | Lo et al. |
| 2010/0144216 A1* | 6/2010 | Daniel et al. ................... 439/862 |
| 2010/0157413 A1 | 6/2010 | Dean et al. |

FOREIGN PATENT DOCUMENTS

| CN | 101650894 A | 2/2010 |
| EP | 1069450 A2 | 1/2001 |
| WO | 03071346 A1 | 8/2003 |
| WO | 2004104671 A1 | 12/2004 |
| WO | 2006021912 A1 | 3/2006 |
| WO | 2009124935 A1 | 10/2009 |

OTHER PUBLICATIONS

Feenstra et al., "Video-speed response in a reflective electrowetting display", IDW Proceedings 2003, 1741 (2003).

* cited by examiner

*Primary Examiner* — Mahidere Sahle
(74) *Attorney, Agent, or Firm* — BainwoodHuang

(57) ABSTRACT

An electrowetting display device comprising a first support plate, a second support plate and a picture element having a space defined by the first support plate, the second support plate and walls of the first support plate. The space comprises a first fluid and a second fluid immiscible with each other, the second fluid being electroconductive or polar and the walls confining the first fluid to the space. The picture element is electrically switchable between a first state without an electric field applied and a second state with an electric field applied, in which in the first state the first fluid is spread out in the picture element and in the second state the first fluid is contracted near one of the walls. Two of the walls have a side facing the space, the sides having different angles with a plane of the first support plate.

20 Claims, 3 Drawing Sheets

ELECTROWETTING DISPLAY DEVICE

CROSS REFERENCE TO RELATED APPLICATIONS

This application claims the benefit under 35 U.S.C. §120 and §365 of International Application No. PCT/EP2012/060840 filed Jun. 7, 2012, the entire contents of which are incorporated herein by reference.

BACKGROUND

An electrowetting display device is known in which a picture element includes a first fluid in the form of a colored oil acting as an optical switch. An electric field in the picture element is used to displace the oil. Without electric field the oil forms an opaque layer which blocks light; with electric field the oil contracts and allows light to transmit through the picture element.

The electric field in the known picture element is applied by an electrode that covers only part of the area of the picture element. The lower electric field in the area of the picture element without electrode causes the oil to contract to this area. The shape of the electrode provides control of the motion of the oil.

It is desirable to improve the control of the motion of the first fluid on application of an electric field.

DETAILED DESCRIPTION

Figure 1:
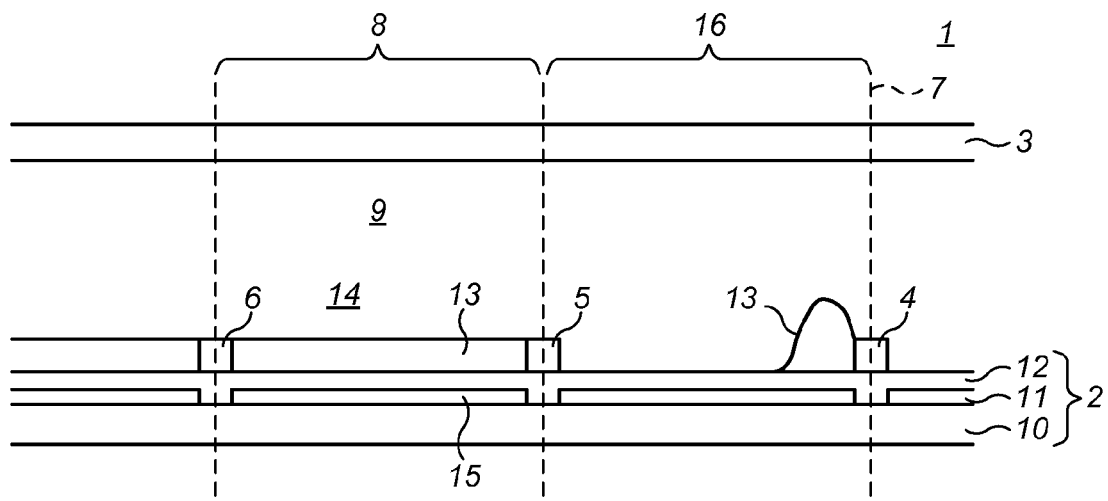
FIG. 1 shows a cross-section of a series of picture elements.

The entire contents of priority applications GB 1110776.0 and GB 1115717.9 are incorporated by reference herein.

The present invention relates to an electrowetting display device and to a method for making the device. Embodiments will first be described in summary form.

In embodiments, there is provided an electrowetting display device comprising a first support plate, a second support plate and at least one picture element,
the picture element having a space defined by the first support plate, the second support plate and walls of the first support plate, the space comprising at least a first fluid and a second fluid immiscible with each other, the second fluid being electroconductive or polar and the walls confining the first fluid to the space,
the picture element of the device being electrically switchable between at least a first state without an electric field applied and a second state with an electric field applied,
in which in the first state the first fluid is spread out in the picture element and in the second state the first fluid is contracted near one of the walls,
wherein at least two of the walls have a side facing the space, the sides having
different angles with a plane of the first support plate.

Embodiments described herein are based on the discovery that the motion of the first fluid in the picture element depends on the slant of the side of a wall of the picture element. The slant appears to be an effective parameter to control the motion of the first fluid, either as the sole parameter or as one of a plurality of parameters to control the motion. The slant can be used to reduce the symmetry of a picture element and thereby create a preferred direction of motion of the first fluid on application of an electric field.

The slant affects the adherence of the first fluid to the wall. In a first class of picture elements an obtuse angle between the side of the wall and the plane of the first support plate increases the adherence and an acute angle decreases the adherence. In a second class an obtuse angle decreases the adherence and an acute angle increases the adherence.

The sides of the walls of a picture element can be given different angles. When an increasing electric field, uniform along the walls, is applied to a picture element of the first class, the first fluid will preferentially start to move away from the wall that has a side with the smallest angle, and will subsequently move preferentially towards a wall that has a side with a larger angle. At higher electric fields the first fluid tends to contract near a wall having a side with the largest angle. In a picture element of the second class, the first fluid will preferentially start to move away from a side with the largest angle towards a side with a smaller angle and contract near a side with the smallest angle.

Hence, an appropriate choice of angles of the sides of the walls surrounding the picture element will assist in controlling the motion of the first fluid when an electric field is applied. It may cause all picture elements in the display device to show the same motion of the first fluid, thereby improving the quality of the image displayed. Larger obtuse angles and smaller acute angles improve the uniformity of motion of the first fluid over the picture elements of the display device.

The use of slanted sides of walls is applicable in display devices having a plurality of picture elements. When an electric field is applied in the picture elements of a known display device which uses a patterned electrode, the motion of the first fluid in the picture elements is not always uniform in that not all first fluid contracts always in the same corner of the square picture elements. Since the human eye is sensitive to deviations from a regular distribution, the collection of part or all of the first fluid of some picture elements of a display device in one corner whereas all first fluid of the majority of picture elements collects in another corner is easily noticeable and affects the quality of the image displayed. Use of slanted sides in the picture elements of the display device improves the uniformity of the motion of the first fluid in the picture elements, thereby enhancing the quality of the image.

A side of a wall is slanting if the angle between the average plane of the side and the plane of the first support plate, the angle facing the first fluid of the pixel, is obtuse or acute. The angle may deviate more than 5 degrees from 90 degrees, i.e. from perpendicular, and may be more than 10 degrees.

It should be noted that an electrowetting display device is known in which the walls of the picture elements have outward slanting sides. However, walls of a picture element having different sides with different angles are not known. The known device does not make use of the slant of the sides to control the motion of the first fluid by employing particular characteristics of the walls.

Embodiments also relate to a method of making an electrowetting display device comprising a first support plate, a second support plate and at least one picture element,
the picture element having a space defined by the first support plate, the second support plate and walls of the first support plate, the space comprising at least a first fluid and a second fluid immiscible with each other, the second fluid being electroconductive or polar and the walls confining the first fluid to the space, the picture element of the device being electrically switchable between at least a first state without an electric field applied and a second state with an electric field applied, in which in the first state the first fluid is spread out in the picture element and in the second state the first fluid is contracted near one of the walls, the method including the step of making at least two of the walls having a side facing the space, the sides having different angles with a plane of the first support plate.

Detailed examples of embodiments will now be described.

FIG. 1 shows a cross-section of a series of picture elements of a prior art display device 1. The device comprises a first support plate 2 and a second support plate 3. The first support plate 2 includes hydrophilic walls 4, 5, 6, which can be made of for example photoresist material such as SU8. Alternatively, the walls or their surfaces can be hydrophobic. The extent of the picture elements is indicated in the FIG. by dashed lines 7. Picture element 8 has a space 9 defined by the first support plate 2, the second support plate 3 and the center of the walls 5 and 6. The first support plate 2 includes a substrate 10, e.g. a plate of glass or plastic, on which electrodes 11 are arranged. Each picture element has an electrode which is connected to a signal line for providing a voltage. The electrodes are covered by a hydrophobic layer 12, for example of the amorphous fluoropolymer AF1600. The first support plate may include other elements, such as transistors and insulating layers, not shown in the FIG. A common size of a picture element is 160 micrometers square. A wall has for example a width of 10 micrometers and a height 3 to 6 micrometers.

The space 9 comprises a first fluid 13, for example oil, confined to the space by the walls 5 and 6, and a second, electroconductive or polar fluid 14, for example water. The fluids are immiscible. When no voltage is applied between the electrode 15 and the second fluid 14, there is no electric field between the second fluid and the electrode; the first fluid 13 is spread out in the picture element and forms a layer adjoining the hydrophobic layer 12, as shown for the picture element 8. When a voltage is applied, the resulting electric field causes the first fluid to contract near one of the walls, as shown for picture element 16. The phrase 'near a wall' means adjoining a wall or being close to a wall; it excludes a contraction on the hydrophobic layer 12 in middle of the picture element.

The movement of the first fluid under the influence of an applied electric field, the so-called electrowetting effect, is more fully described in international patent application WO2003/071346. When the oil and/or the water has specific optical properties for absorption, reflection and/or transmission of light, the picture element can operate as a light valve in a display.

Figure 2:
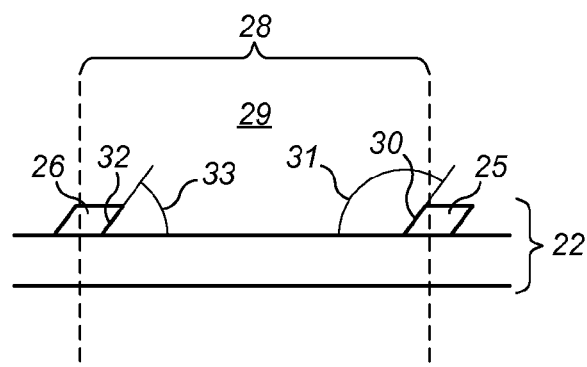
FIG. 2 shows a cross-section of a picture element.

In the display device according to embodiments, sides of walls are slanting, as shown in for example the cross-section of picture element 28 in FIG. 2. The support plate 22 is similar to the support plate 2 shown in FIG. 1, except for the slant of sides of the walls. Wall 25 has a slanting side 30, facing space 29 of the picture element. The plane of the side 30 forms an obtuse angle 31 with the plane of the first support plate 22.

Similarly, the wall 26 has a slanting side 32 facing the space 29 and having an acute angle 33 with the plane of the first support plate 22. Sides 30 and 32 are called outward and inward slanting sides, respectively. Although the walls shown in FIG. 2 have a relatively small height, allowing the second fluid 14 to be shared by the picture elements, the walls may be higher and extend from the hydrophobic layer 12 to the first support plate 3.

The angle can be determined by cutting the first support plate along a cross-section of a wall and measuring the angle of the edge of the cross-section using a microscope. Roughness of the wall can be taken into account by fitting a straight line through the edge using the least-squares method. The angle may be determined at several locations along a wall and an average value taken.

When no electric field is applied to the picture element 28, the first fluid forms a layer between the walls 26 and 25, similar to the layer shown in the picture element 8 of FIG. 1. It has been observed in a first class of picture elements that on increasing the electric field, the first fluid preferentially starts moving away from a wall having a side with the smallest angle in the picture element. In FIG. 2 the first fluid in picture element 28 will start moving away from the inward slanting side 32 rather than from the outward slanting side 30. When the picture elements of the display device have the same configuration of slanting sides of the walls, the initiation of the motion of the first fluid will be the same or similar in the picture elements, which improves the quality of the image displayed on the display device.

At increasing applied electric fields the first fluid has a tendency to contract near a slanting side of a wall in the picture element having the largest angle. In FIG. 2 the first fluid tends to contract near the outward slanting side 30. Hence, the slant of the sides of the walls in a picture element can be used to affect the motion of the first fluid when an electric field is applied.

The angle of a slanting side with the plane of the first support plate may be between 50 and 70 degrees or between 110 and 130 degrees. In some embodiments the angle is 59, 67, 72, 108, 113 or 121 degrees. The angle may be larger than 30 degrees and smaller than 150 degrees. The effect of the angle on the motion of the first fluid can be observed experimentally, for example by observing the motion in a series of different picture elements which have at least one side that has a different angle for each picture element. Such a series of picture elements may for example be made on one support plate as described below by using different angles of irradiation of the photoresist on different parts of the support plate.

In a second class of picture elements, the direction of motion is opposite to that in the first class: the first fluid starts preferentially to move away from a side having the largest angle and, at increasing electric fields, move towards a side having the smallest angle.

Whether a picture element belongs to the first class or to the second class is determined by properties of the picture element, which may include the properties of the first and second fluid and the materials in contact with the fluids, the annealing temperature of the hydrophobic layer 12, the thickness of this layer, and the filling level of the first fluid in the picture element. The class of a picture element can be determined experimentally by observing the motion of the first fluid in the picture element on application of an electric field.

Where a picture element includes more than one wall having an inward or outward slanting side, the angles of the sides may be made different for improved control of the motion of the first fluid. FIG. 3 shows a top view of several embodiments of the picture element. Only the position of the side of the wall facing the space of the picture element is shown. Although the cross-section of most embodiments in the FIG. is rectangular, other shapes of the cross-section are possible, such as triangular or circular. The term 'rectangular' encompasses 'square'. The motion of the first fluid in the embodiments shown in FIG. 3 pertains to embodiments of the first class. Similar FIGS. can be made for embodiments of the second class, in which the first fluid moves in the opposite direction.

Figure 3A:
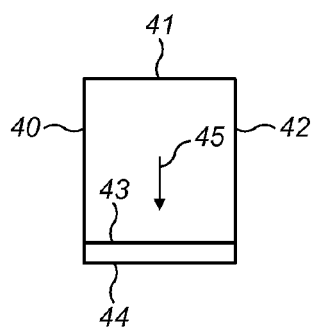
FIGS. 3(*a*), 3(*b*), 3(*c*), 3(*d*), 3(*e*) and 3(*f*) show plan views of picture elements.

FIG. 3a shows a picture element having three walls with perpendicular sides 40, 41, 42. One wall has an outward slanting side, the lower end of the side, intersecting the hydrophobic layer 12, being indicated by line 43 and the upper end, at the top of the wall, by line 44. On application of an electric field to the picture element, the first fluid will tend to collect near side 43, 44, in the direction of the arrow 45.

Figure 3B:
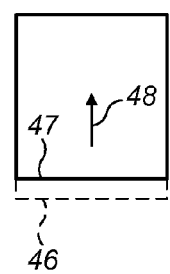

FIG. 3b shows a picture element also having one slanting wall. The side is inward slanting, the lower end being indicated by the dashed line 46 and the upper end by the drawn line 47. On application of an electric field, the first fluid will start moving away from the slanting side in the direction of the arrow 48.

Figure 3C:
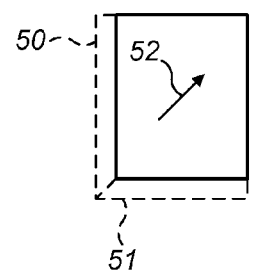

FIG. 3c shows a picture element including two adjacent walls having an inward slanting side 50, 51, causing a preferred direction of motion of the first fluid along a diagonal of the rectangle, indicated by the arrow 52. When the two adjacent walls have instead an outward slanting side, the preferred direction of motion will be reversed.

Figure 3D:
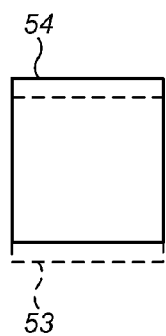

FIG. 3d shows a picture element having an inward slanting side 53 and an outward slanting side 54, both sides reinforcing motion of the first fluid from side 53 to side 54 at low electric fields. The use of both inward and outward slanting walls increases the control of the motion of the first fluid. At higher electric fields the first fluid prefers to contract in one of the corners of the side 53, which is energetically favorable due to the larger radius of curvature of the first fluid. If the electrode of the picture element does not extend into an area in one of these corners, as described in patent application WO2004/104671, the first fluid will preferentially contract in that corner at higher electric fields. In any embodiment where the fluid has no clear preference to contract to one corner, this patterned electrode can be used to create such a preference.

Figure 3E:
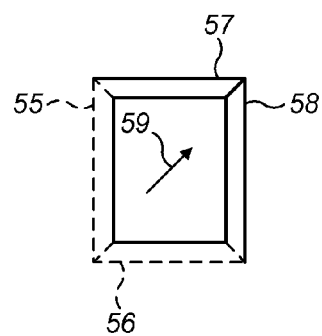

FIG. 3e shows a picture element having two adjacent inward slanting sides 55 and 56 and two adjacent outward slanting sides 57 and 58. At lower electric fields, this configuration forces the first fluid in the direction of the arrow 59 to the corner between the two outward slanting sides. At higher electric fields the first fluid preferentially contracts in the corner either between sides 55 and 57 or between sides 57 and 58, depending on the geometries and properties of the materials of the picture element. The difference in geometry of the corners creates a clear preference for the contraction in one specific corner.

Figure 3F:
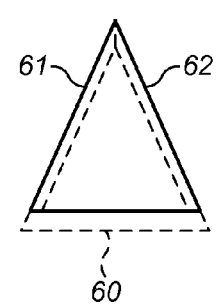

FIG. 3f shows a triangular picture element having an inward slanting side 60 and two outward slanting sides 61 and 62, forcing the first fluid from near the side 60 towards the vertex of the sides 61 and 62.

When picture elements according to the embodiments shown in FIGS. 3d and 3e are arranged in a display matrix configuration, the walls between neighboring picture elements can suitably be made using the slanting illumination method set out below using a single exposure. Both sides of the walls may be perpendicular to the plane of the first support plate or have complementary obtuse and acute angles, the sum of the obtuse and acute angles being 180 degrees. Other embodiments in FIG. 3 may require more than one exposure.

The slanting sides may be combined with other measures to control the motion of the first fluid within the picture element. In particular, known methods of defining areas for preferred initiation and/or collection of first fluid by special configurations of the electrode(s) are envisaged.

Figure 4A:
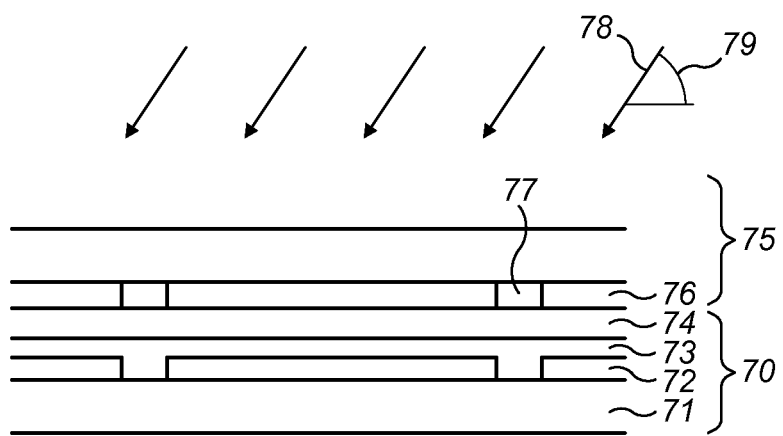
FIGS. 4(*a*) and (*b*) shows a set-up for making walls having slanting sides.

FIG. 4a shows a set-up for manufacturing a first support plate having walls with slanting sides for use in an electrowetting display device according to embodiments. The set-up can be used for so-called inclined and/or rotated lithography.

The first support plate 70 includes a substrate 71, electrodes 72 and a hydrophobic layer 73. A photoresist layer 74 is spun unto the hydrophobic layer 73; SU8 may be used as photoresist. A transparent mask 75, made for example of glass, includes an opaque layer 76, for example of chrome, having apertures 77. The mask 75 is arranged on the photoresist layer 74 and illuminated with a parallel radiation beam 78 of UV light. The beam is slanting or oblique and forms an angle 79 with the plane of the first support plate. The angle 79 may be obtained by tilting the beam with respect to the support plate or tilting the support plate with respect to the beam.

The slanting beam causes slanting regions of the photoresist layer 74 to be exposed through the apertures 77. The plane of incidence of the beam 78 may be rotated around an axis perpendicular to the support plate to align the beam with the pattern of apertures 77 in the mask 75. By suitable choice of the plane of incidence, different configurations of walls having slanting and any non-slanting sides may be obtained. For example, when the beam is substantially aligned with the apertures, a configuration as shown in FIG. 3(a), (b) or (d) can be made, and when substantially aligned with a diagonal of a rectangle of apertures, a configuration as shown in FIG. 3(c) or (e) can be made.

The configuration of FIG. 3(e) may be made by irradiating the support plate with the beam set at an angle 79 between 10 and 60° and a plane of incidence set at an angle between 10 and 40° clockwise from the vertical direction in the FIG. The vertical direction in FIG. 3(e) corresponds to the direction of a series of apertures 77 in the mask 75 in FIG. 4(a). These conditions have been shown to achieve an improved and uniform motion of the first fluid, in particular in square picture elements.

Figure 4B:
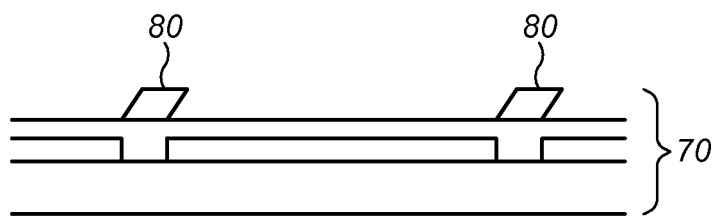

The exposure time of the slanted beam may have to be longer than for the perpendicular exposure used in known techniques. As shown in FIG. 4b, after developing the photoresist layer, the first support plate 70 is provided with walls 80 of SU8, the walls having sides slanting at an angle determined by the angle 79 of the illuminating beam 78. The manufacturing costs of a first support plate made according to embodiments described herein are about the same as known techniques.

Alternatively, walls having slanting sides may be made using positive or negative photoresist and grey-scale masks, making it possible to manufacture walls having a triangular or trapezoidal cross-section, having either the longer or shorter parallel side in contact with the hydrophobic layer. The photoresist may have a lower hydrophobicity than the hydrophobic layer 73 for the electrowetting effect.

In the embodiment of FIG. 4 the hydrophobic layer 73 is arranged below the walls. Alternatively, the hydrophobic layer may be arranged between the walls, as described for example in patent U.S. Pat. No. 7,746,540.

The specific motions of the first fluid as described above in embodiments depend on process conditions used to manufacture the display device.

The walls in the above embodiments are straight sections of a barrier confining the first fluid to a picture element. However, a wall may also be a curved section of such a barrier. Although the embodiments show walls that have a slanting side extending from one corner to a neighboring corner, the slanting side may also extend along only part of a wall, e.g. extending from one corner along only part of a wall.

The above embodiments are to be understood as illustrative examples. Further embodiments are envisaged. The display device may contain a single picture element, acting as a light valve; it may also contain a plurality of picture elements, which may be arranged in a matrix configuration. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the accompanying claims. Use of the verbs "to comprise" and "to include" and their conjugations does not exclude the presence of elements other than those stated in the claims.

What is claimed is:

1. An electrowetting display device comprising a first support plate, a second support plate and at least one picture element,
   the at least one picture element having a space formed by the first support plate, the second support plate and walls of the first support plate, the space comprising at least a first fluid and a second fluid immiscible with each other, the second fluid being at least one of electroconductive or polar and the walls including walls substantially confining first fluid for adjoining a surface of the first support plate within a picture element of the at least one picture element,
   the at least one picture element of the device being electrically switchable between at least a first state without an electric field applied and a second state with an electric field applied,
   in which in the first state the first fluid is spread out in the picture element and in the second state the first fluid is contracted near one of the walls,
   wherein the walls substantially confining first fluid comprise:
   a first wall with a side adjoining at least one of the first or second fluids, wherein the side of the first wall is angularly displaced from the surface by a first angle in the space; and
   a second wall with a side adjoining at least one of the first or second fluids, wherein the side of the second wall is angularly displaced from the surface by a second angle in the space,
   wherein a magnitude of the first angle in the space is different from a magnitude of the second angle in the space.

2. An electrowetting display device according to claim 1, wherein at least one of the walls substantially confining first fluid has an inward slanting side facing the space and at least one of the walls substantially confining first fluid has an outward slanting side facing the space.

3. An electrowetting display device according to claim 1, wherein the walls substantially confining first fluid include at least two adjacent walls, both having an inward slanting side facing the space or an outward slanting side facing the space.

4. An electrowetting display device according to claim 1, wherein the picture element of the at least one picture element has a rectangular cross-section and the walls substantially confining first fluid comprise four walls, two adjacent of the four walls having an inward slanting side facing the space and two adjacent of the four walls having an outward slanting side facing the space.

5. An electrowetting display device according to claim 1, wherein the magnitude of one or more of the first angle in the space or the second angle in the space is smaller than 85 degrees or larger than 95 degrees.

6. An electrowetting display device according to claim 1, wherein the magnitude of one or more of the first angle in the space or the second angle in the space is in the range of one of: from 50 to 70 degrees or from 110 to 130 degrees.

7. A method of making an electrowetting display device, including:
   making on a surface a first wall with a side for adjoining, in a space of at least one picture element of the electrowetting display device, at least one of a first fluid or a second fluid immiscible with the first fluid, the side of the first wall being angularly displaced from the surface by a first angle in the space; and
   making on the surface a second wall with a side for adjoining, in the space of the at least one picture element of the electrowetting display device, at least one of the first fluid or the second fluid, the side of the second wall being angularly displaced from the surface by a second angle in the space,
   wherein a magnitude of the first angle in the space is different from a magnitude of the second angle in the space.

8. A method of making at least one wall of a first support plate for an electrowetting display device, including:
   dispensing on a plate a layer of photoresist;
   illuminating the layer of photoresist with a slanting radiation beam through a mask; and
   developing the layer of photoresist to form the at least one wall, the at least one wall comprising:
   a first wall with a side for adjoining, in a space of at least one picture element of the electrowetting display device, at least one of a first fluid or a second fluid immiscible with the first fluid, the second fluid being at least one of electroconductive or polar, the side of the first wall being angularly displaced from a surface of the first support plate by a first angle in the space; and
   a second wall with a side for adjoining, in the space of the at least one picture element of the electrowetting display device, at least one of the first fluid or the second fluid, the side of the second wall being angularly displaced from the surface of the first support plate by a second angle in the space,
   wherein a magnitude of the first angle in the space is different from a magnitude of the second angle in the space.

9. A method according to claim 8, wherein the slanting radiation beam has an angle between 10 and 60 degrees with a plane of the surface of the first support plate.

10. A method according to claim 8, wherein the slanting radiation beam has a plane of incidence at an angle between 10 and 40 degrees with a direction of a series of apertures in the mask.

11. A method of making at least one wall of a first support plate for an electrowetting display device, including:
    dispensing on a plate a layer of at least one of a positive or negative photoresist;
    illuminating the layer of photoresist with a radiation beam through a mask; and
    developing the layer of photoresist to form the at least one wall, the at least one wall comprising:
    a first wall with a side for adjoining, in a space of at least one picture element of the electrowetting display device, at least one of a first fluid or a second fluid immiscible with the first fluid, the second fluid being at least one of electroconductive or polar, the side of the first wall being angularly displaced from a surface of the first support plate by a first angle in the space; and
    a second wall with a side for adjoining, in the space of the at least one picture element of the electrowetting display device, at least one of the first fluid or the second fluid, the side of the second wall being angularly displaced from the surface of the first support plate by a second angle in the space, wherein a magnitude of the first angle in the space is different from a magnitude of the second angle in the space.

12. An electrowetting display device according to claim 1, wherein the side of the first wall slants inwards towards the surface and the side of the second wall slants outwards from the surface.

13. An electrowetting display device according to claim 1, wherein at least one of:
   a plane of the side of the first wall is substantially parallel to a plane of a further side of the first wall; or
   a plane of the side of the second wall is substantially parallel to a plane of a further side of the second wall.

14. An electrowetting display device according to claim 1, wherein each of the first and second angles in the space is less than 180 degrees.

15. An electrowetting display device according to claim 1, wherein the side of the first wall and the side of the second wall face the space.

16. An electrowetting display device according to claim 1, wherein, with said picture element of the at least one picture element being switched to the first state, at least one of the side of the first wall or the side of the second wall is adjoined by the first fluid.

17. An electrowetting display device according to claim 1, wherein the side of the first wall and the side of the second wall adjoin the surface.

18. An electrowetting display device according to claim 1, wherein the side of the first wall opposes the side of the second wall.

19. An electrowetting display device according to claim 1, wherein a plane of the side of the first wall is substantially parallel to a plane of the side of the second wall.

20. An electrowetting display device according to claim 1, wherein the first angle in the space is an acute angle and the second angle in the space is an obtuse angle.

* * * * *